(12) United States Patent
Nygren et al.

(10) Patent No.: US 6,201,705 B1
(45) Date of Patent: Mar. 13, 2001

(54) MAGAZINE FOR ENCLOSING A PLURALITY OF CIRCUIT BOARDS

(75) Inventors: Lars Göran Nygren, Tumba; Uno Dahl, Hägersten; Jan Roger Wennerberg, Nynäshamn; Lars Yngve Bertilsson, Stockholm, all of (SE)

(73) Assignee: Telefonaktiebolaget LM Ericsson, Stockholm (SE)

( * ) Notice: Subject to any disclaimer, the term of this patent is extended or adjusted under 35 U.S.C. 154(b) by 0 days.

(21) Appl. No.: 08/981,121

(22) PCT Filed: Jun. 17, 1996

(86) PCT No.: PCT/SE96/00787

§ 371 Date: Dec. 18, 1997

§ 102(e) Date: Dec. 18, 1997

(87) PCT Pub. No.: WO97/01264

PCT Pub. Date: Jan. 9, 1997

(30) Foreign Application Priority Data

Jun. 20, 1995 (SE) .................................................. 9502240

(51) Int. Cl.⁷ ................................ H05K 7/14; H05K 7/20
(52) U.S. Cl. ........................ 361/753; 361/688; 361/756; 361/796; 361/797; 165/80.3; 174/16.1
(58) Field of Search ..................................... 361/688, 690, 361/702, 704, 720, 724, 753, 756, 752, 796, 797, 800, 802, 816, 818; 454/184; 165/80.3, 185, 104.33; 174/15.1, 16.1

(56) References Cited

U.S. PATENT DOCUMENTS

| 4,454,566 | * | 6/1984 | Coyne ................................. 361/700 |
| 4,758,924 | | 7/1988 | Dillon et al. . | |
| 4,840,225 | * | 6/1989 | Foley et al. ...................... 165/104.33 |
| 5,218,516 | | 6/1993 | Collins et al. . | |
| 5,777,846 | * | 7/1998 | Hayes et al. .......................... 361/690 |
| 5,844,777 | * | 12/1998 | Gates ................................... 361/700 |

FOREIGN PATENT DOCUMENTS

| 3717009 C2 | 9/1990 | (DE) . |
| 0091733 A1 | 10/1983 | (EP) . |
| 0234550 A3 | 9/1987 | (EP) . |
| 0449150 A3 | 10/1991 | (EP) . |
| 0472269 A3 | 2/1992 | (EP) . |
| 0539341 A1 | 4/1993 | (EP) . |
| 0564315 A1 | 10/1993 | (EP) . |

* cited by examiner

Primary Examiner—Jayprakash N. Gandhi
(74) Attorney, Agent, or Firm—Burns, Doane, Swecker & Mathis, L.L.P.

(57) ABSTRACT

The invention relates to a magazine (1) adapted for enclosing a plurality of circuit boards (2) in side-by-side relationship, and comprises a plurality of guide strips (3a, 3b) on mutually opposing inner wall parts, wherein mutually opposing and mutually corresponding guide strips are adapted for coaction with mutually opposing circuit board edge parts (2c, 2e) for the guiding of a circuit board (2). The magazine includes heat-emitting means in the form of a plurality of vertical cooling channels (4a, 4b, 4c) delimited by wall parts, wherein two of these wall parts are placed close together with their respective outer surfaces (21a″, 22a) facing towards a respectively closely adjacent circuit board position. The mutually opposing open end parts of respective cooling channels extend towards and/or through mutually opposing upper and lower wall parts (1a, 1b) and are positioned between two mutually adjacent guide strips (3a, 3b), and a circuit board and associated components (2b′) are positioned closely adjacent to one of said two channel-forming wall parts (22a).

23 Claims, 3 Drawing Sheets

Fig. 4
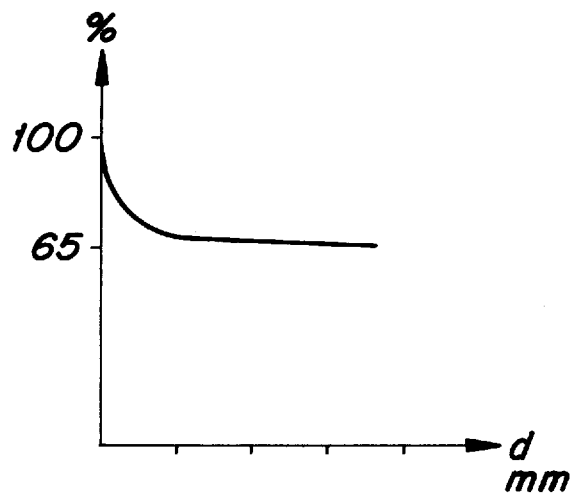
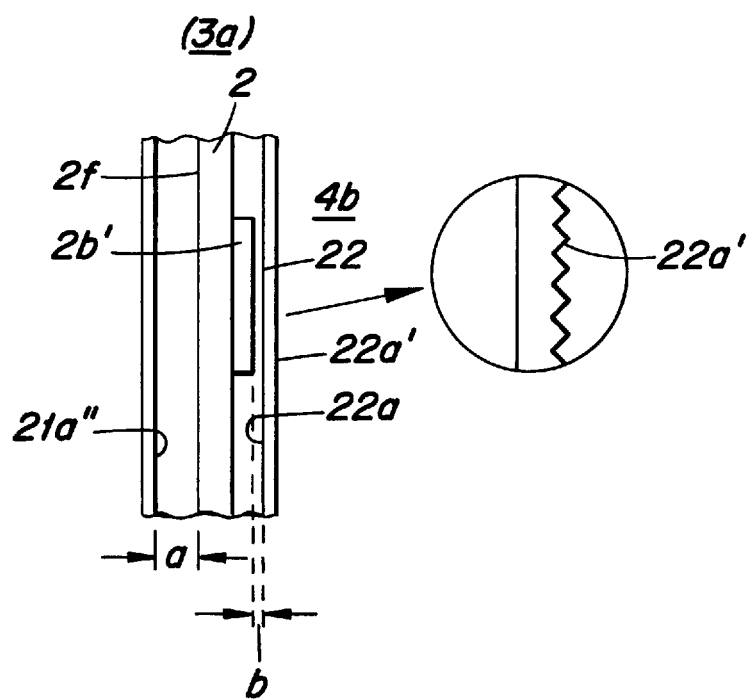
Fig. 5

MAGAZINE FOR ENCLOSING A PLURALITY OF CIRCUIT BOARDS

This is a national stage of International Application PCT/SE96/00787, with an international filing date of Jun. 17, 1996, the disclosure of which is incorporated into this application by reference.

FIELD OF INVENTION

The present invention relates to a magazine and then particularly to a magazine which is adapted to accommodate a plurality of printed circuit boards in side-by-side relationship.

By circuit board is meant a printed circuit board having surface-mounted or hole-mounted discrete or integrated components.

Magazines of this kind include mutually facing inner wall-part surfaces on which mutually opposite and mutually corresponding guide strips are mounted for coaction with mutually opposite edge parts of a circuit board such as to guide a circuit board having a plurality of edge-related contact surfaces into the magazine and into mechanical and electrical coaction between said contact surfaces and magazine-mounted contact strips, or for guiding the circuit board out of said magazine, and means for dissipating heat generated by the circuit board and its components to the outside of said magazine.

Heat is conducted to the outside of the magazine with the aid of a coolant which is exemplified in the following in the form of a cooling airflow. This airflow will primarily be self-circulating, a prerequisite which is fundamental to the following description, although forced airflows generated by fans and blowers are also conceivable, with a larger heat dissipation.

The person skilled in this art will be well acquainted with the measures that should be taken when replacing the cooling airflow with some other form of cooling means.

BACKGROUND

Several different designs of magazines of the aforesaid kind are known to the art.

One type of magazine is known in which a circuit board is placed on or surrounded by a metal casing or the like which is brought into mechanical contact with requisite cooling fins.

Examples of this technology are described an shown in publications;

EP-A1-0 564 315,

EP-A2-0 449 150 and

DE-C2-37 17 009.

U.S. Pat. No. 5,768,924 is also relevant in this context, and describes and illustrates a magazine for electronic equipment which enables the equipment to be readily accessed.

Cables are outed and positioned so as to have no affect, or only a slight affect, on the cooling process through convection within the casing.

It is also mentioned that high power equipment, such as power units, can be mounted on one side of the casing, so as to enable these parts to be cooled by a first fan-controlled airflow, and to cool remaining parts by means of a second fan-controlled air flow.

It is also mentioned that the front and the rear sides have horizontal slots through which cooling air can flow, and an electrically conductive grid or grating behind the slots so as to minimize interference, such as RFI (Radio Frequency Interference).

Publication EP-A1-0 091 733 describes and illustrates a circuit board arrangement in which respective circuit boards (24) are displaceably disposed in a casing (20, 21), in mutually opposing guide channels (22).

Described in this publication is a cooling module (1) which has planar side walls (2) and which is end-sealed so that a flow of pressurized cooling air is able to pass into a cooling channel.

A compressed air source is connected to the formed cooling channel and the channel side-walls are provided with nozzles or jets positioned so that respective air flows through respective nozzles are directed onto one or more heat-intensive components.

Publication EP-A1-0 539 341 also teaches an arrangement for cooling electronic equipment or electronic circuit board mounted components. In this case, heat is transferred by radiation.

It will be particularly noted in this case that both a circuit board (1) and a cooling plate (3) are so treated as to exhibit a high coefficient of IR-radiation (Infrared Radiation), wherewith heat is transferred from the heated circuit board to the relatively cool plate.

Publication U.S. Pat. No. 5,218,516 teaches an electronic module which includes a printed circuit board with electronic components mounted on one side of the board and with the opposite side of said board placed in heat conductive contact with a cold surface, more specifically with cooling fins. The mounted circuit board is enclosed in a casing (16) and is therewith isolated from and free from the surrounding atmosphere.

Publication EP-A2-0 472 269 discloses the possibility to increase the contact surface of the circuit board in order to dissipate heat generated within the circuit board, without needing to expose the circuit board or its components to the cooling means.

The disclosures made in publication EP-A 0 234 550 also exemplify the present standpoint of techniques with regard to circuit board cooling in a dust-free environment.

It is also known that heat is emitted from a surface by radiation and by convection.

SUMMARY OF THE PRESENT INVENTION

Technical Problems

When considering the earlier standpoint of techniques as described in the aforegoing, it will be seen that a technical problem resides in the provision of a magazine for accommodating a plurality of vertically orientated printed circuit boards with the aid of simple means, and which provides a completely closed chamber for the circuit boards enclosed in the magazine and still provide conditions whereby a coolant, such as an air flow, can pass through readily formed cooling channels or passageways which are fully closed from the circuit board spaces or circuit board chamber and thereby provide conditions for completely sealing respective closed chambers against the ingress of particles and other contaminants and therewith fully screen respective closed chambers with regards to present EMC- (Electro Magnetic Compatibility) requirements.

It will also be seen that a technical problem resides in enabling conditions to be retained whereby the magazine affords effective EMC-protection while still enabling one or more circuit boards to be readily exchanged and/or the magazine to be supplemented with further circuit boards.

A technical problem also resides in providing a magazine construction which provides a high degree of flexibility with regard to the choice of circuit boards that have different total heat emissions and different distribution of heat-generating surface parts and outer environment solely with the aid of air flow convection as a cooling agent.

It will also be seen that a technical problem resides in providing a magazine whose basic construction is such as to provide effective convection cooling and effective EMC protection and which can also be readily adapted to circuit boards of different standard sizes.

It will also be seen that a further technical problem is one of realizing the significance of permitting the requisite heat transfer to take place from circuit boards to at least one cooling wall surface primarily via radiation, where the cooled and cooling wall surface may be located in the very close proximity of the heat-generating components on the circuit board or a flat surface.

It will also be seen that a technical problem resides in recommending those dimensions applicable for conditions which enable the heat taken up in an outer cooling wall surface to be transferred to a convection air flow passing through the cooling channel.

It will be seen that a technical problem is one of providing a magazine of the kind defined in the introduction in which the opposing cooled wall-parts of an individual cooling channel enclose a circuit board in the form of a casing with a small space between the outer surfaces of the circuit board and an adjacent cooled surface.

It will also be seen that a technical problem resides in providing a magazine in which the coolant is comprised of an air flow which passes through a plurality of mutually parallel cooling channels which are delimited by wall-parts of which two wall-parts are mutually opposed and have a relatively large surface extension and are placed close together with their mutually distal outer surfaces facing towards a respective closely adjacent circuit board position.

It will also be seen that a technical problem is one of creating conditions in a simple manner such that the mutually opposing open end-parts of a cooling channel for respective air flows extend towards and preferably through opposite, such as upper and lower, magazine wall-parts and positioned between two mutually adjacent guide strips so as to enable a mounted circuit boards to be inserted via said guide strips.

It will also be seen that a technical problem resides in realizing the significance of and the advantages afforded by positioning a circuit board surface, having discrete or integrated components, close to one of two channel-forming wall-parts, and of positioning one circuit board surface close to another wall-part of another cooling channel, and by positioning the discrete to integrated components on the circuit board close to one wall-part of one cooling channel.

It will also be seen that a technical problem resides in realizing the advantages of having one more circuit board position than the number of cooling channels and therewith use the end-parts, such as vertical end-parts, of the magazine as cooling wall-parts.

It will also be seen that a technical problem is one of realizing the significance of and the conditions required in choosing the distance between mutually opposing wall-parts of an individual cooling channel in a given determined relationship with the distance of the cooling channel between mutually opposing wall-parts while taking the length of the cooling channel into account.

In view of the fact that the cooling channels of a compact magazine arrangement will preferably be narrow, a further technical problem is one of dimensioning the internal form of the cooling channels in a manner to obtain an effective cooling air flow, and with an adapted inner and outer surface extension.

Solution

With the intention of solving one or more of the aforesaid technical problems, the present invention takes as its starting point a magazine which is constructed to accommodate a plurality of circuit boards in preferably vertical side-by-side relationship, for instance a printed circuit board having surface of hole-mounted discrete or integrated components, wherein the magazine includes a plurality of mutually opposing, such as upper and lower, inner wall-parts for magazine-associated guide strips, where mutually opposing and mutually corresponding guide strips are adapted for coaction with mutually opposing edge-parts of a circuit board to enable a circuit board having a number of edge-related contact surfaces to be inserted into the magazine and into mechanical and electrical coaction between said contact surfaces and magazine-associated contact strips, and to enable a circuit board to be withdrawn from the magazine, and wherein the magazine further includes means for dissipating heat developed by the circuit board to the outside of the magazine with the aid of cooling means, such as a cooling air flow.

According to the invention, the means by which circuit-board generated heat is dissipated or led to the outside of the magazine comprises a plurality of cooling channels, such as vertical cooling channels, that are delimited by wall-parts, wherein two of these wall-parts are opposite one another and placed vertically close together, with their outer mutually distal surfaces facing towards a respective closely adjacent circuit board position.

The mutually distal upper and lower open end-parts of respective cooling channels extend towards and preferably through a respective mutually opposing, such as upper and lower, wall-part, and are positioned between two mutually adjacent guide strips, wherein the circuit board or its components shall be positioned closely adjacent to one of said two mutually opposing channel-forming wall parts.

According to proposed embodiments that lie within the scope of the inventive concept, one surface of the circuit board shall be positioned closely adjacent to one wall-part of a first cooling channel, and the discrete or integrated components on the circuit board shall be positioned closely adjacent to one wall-part of an adjacent second cooling channel.

It is also proposed that the number of circuit board positions will be one more than the number of cooling channels.

It is also proposed that the circuit board will be enclosed by a cover member to provide EMC-protection.

Finally, a number of different cooling-channel cross-section configurations are proposed for adapting cooling in accordance with anticipated heat emissions and heat distributions.

Advantages

Those advantages that are primarily afforded by an inventive magazine reside in the provision of conditions whereby a plurality of circuit boards can be enclosed in a magazine in a simple manner, wherewith respective circuit boards may be enclosed in an EMC-protected closed chamber, and wherein the cooling air flow is able to pass through cooling channels that are totally separate from the closed chamber, and wherewith conditions have been created for cooling circuit boards with impure air and for readily cleaning the cooling channels.

The primary characteristic features of an inventive magazine are set forth in the characterizing clause of the following Claim 1.

BRIEF DESCRIPTION OF THE DRAWINGS

An exemplifying embodiment at present preferred and having features significant of the present invention will now be described with reference to the accompanying drawing, in which

FIG. 4 is a graph showing power yield (radiation and convection) in dependence of distance;

FIG. 5 is an enlarged sectional view of a circuit board and adjacent wall-parts of two adjoining cooling channels;

DETAILED DESCRIPTION OF PREFERRED EMBODIMENTS

Figure 1:
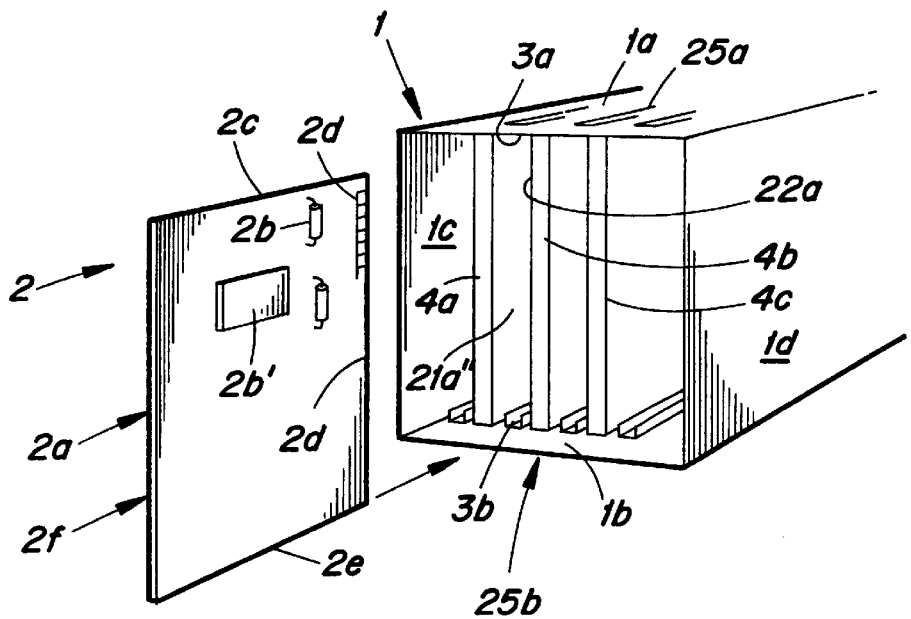
FIG. 1 illustrates a magazine constructed in accordance with the invention and shows a circuit board positioned outside the magazine.

FIG. 1 illustrates schematically and in perspective a magazine 1 which is constructed to enclose a plurality of circuit boards in vertical side-by-side relationship, of which only one circuit board 2 is shown in FIG. 1. Each of the circuit boards 2 comprises a printed circuit board 2a that includes surface-mounted or hole-mounted discrete or integrated components, such as the capacitor 2b or the IC circuit 2b' shown in FIG. 1.

The magazine 1 includes a plurality of mutually opposite guide strips on respective upper and lower wall-parts 1a, 1b, where mutually opposing and mutually corresponding guide strips 3a, 3b for guiding the circuit board 2 are adapted for coaction with mutually opposing edge-parts 2c, 2e of the circuit board in a manner to enable the circuit board 2, having a plurality of edge-related contact surfaces 2d' orientated along an edge 2d of the circuit board, to be inserted into the magazine for mechanical and electrical coaction between said contact surfaces 2d' and contact strips mounted in the interior of the magazine, these contact strips not being shown in FIG. 1 but being well known to the person skilled in this art.

The guide strips 3a, 3b also function to guide a circuit board 2 as it is withdrawn from the magazine 1.

the magazine also includes means for conducting heat generated by a circuit board to the outside of the magazine 1, primarily with the aid of a plurality of parallel air flows.

The magazine 1 is constructed from an electrically conductive material, so that the circuit board 2 can be completely shielded.

According to the present invention, the aforesaid means are comprised of a plurality of cooling channels delimited by parallel wall-parts, of which channels only three channels 4a, 4b and 4c are shown in the drawing.

Figure 2:
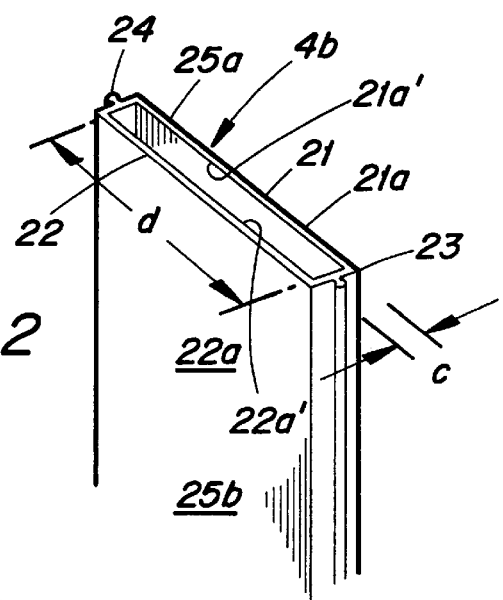
FIG. 2 is a sectional view in perspective of a first embodiment of a used cooling channel.
Figure 3:
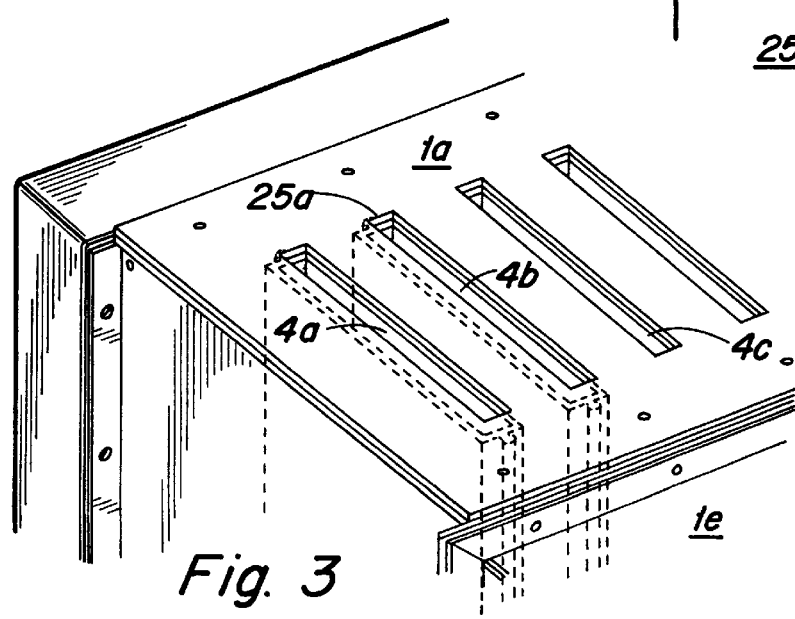
FIG. 3 is a perspective view of a magazine according to FIG. 1 closed with an EMC-protection cover.

The channels may advantageously be mutually identical, and FIG. 2 shows one embodiment of one channel 4b in perspective.

The cooling channel 4b illustrated in FIG. 2 is an extruded light-metal profile and includes two mutually parallel wall-parts 21, 22 of large surface extension, and narrow intermediate, edge-orientated wall-parts 23, 24.

The wall-parts 21, 22 can be regarded as opposite one another and are placed close together with each of their mutually distal surfaces 21a, 22a facing towards a respective closely adjacent circuit board position. The wall-parts 21, 22 have mutually opposing inner surfaces 21a' and 22a'.

The mutually opposing upper and lower open end-parts 25a, 25b of the cooling channel 4b through which air flows and which extends towards and through respective mutually opposing wall-parts 1a, 1b of the magazine 1.

Each cooling channel 4b is located between two mutually adjacent guide strips. The circuit board surface or its components 2b, 2b' are positioned close to one of said two mutually opposing and channel-forming wall-parts 21 and 22 respectively.

It is proposed that the preferably flat surface 2f of the circuit board 2 shall be positioned closely adjacent to the surface 21a" of one defining wall-part of the cooling channel 4a, and that the components 2b, 2b' on the circuit board shall be positioned closely adjacent to a defining wall-part 22a of an adjacent cooling channel.

It is particularly proposed that the number of circuit board positions will be one more than the number of cooling channels, so that the mutually opposing vertical end-wall parts 1c, 1d can also be used as cooling wall-parts.

The chosen distance between mutually opposing wall-parts and dimensioning in other respects with regard to individual cooling channels will be described in more detail below with reference to FIGS. 4 and 5.

A metal cover 1e is provided for enclosing the circuit board 2 as an EMC-shied and therewith forms the magazine with the cover a completely enclosed space.

FIG. 4 illustrates a principle example of the dependency of the power yield on the distance between a heat-emitting surface and a heat-absorbing surface.

At distance "0", the surfaces are in mutual mechanical contact, whereafter the power yield diminishes with distance as shown by the graph.

The present invention is based on the heat yield being effected essentially through thermal radiation, wherewith the "component-cooled surface" distance is not critical.

Part of the heat yield, however, is effected by thermal conduction in the medium (the air space) between component and adjacent cooled surface.

This part of the heat yield is directly distance-dependent, and consequently the distance will preferably be minimized, among other things. A small distance also provides a more compact magazine.

Practical evaluations indicate that the distance should be as small as is practically possible, for instance 0.5–1.0 mm.

FIG. 5 is an enlarged cross-sectional view of a circuit board 2 having a heat-generating component 2b'.

The invention is based on the principle that the distances "a" and "b" shall be as small as possible in practice, which can be achieved by adapting the positioning of the guide strips 3a–3b between the cooling channels and the distance between the mutually opposing wall-parts (2a"–22a) of adjacent cooling channels.

It can be mentioned that when one of the components, such as the circuit 2b', generates a high degree of heat locally or within a limited area, the thickness of the wall-part 22 can be increased to obtain more effective distribution of heat to a larger surface area 22a'.

It can also be mentioned that localized or spot-related, high generation of heat in a discrete component 2b' mounted on one side of the circuit board will also heat the circuit board itself.

Copper foil layers in the circuit board 2 distribute the heat more effectually than the insulating layers. The surface 2f shall therewith be placed very close to the surface 21a" so as to achieve effective heat transfer. (Closer than is shown in the Figure).

Since heat is primarily transferred by radiation mutually opposing surfaces, circuit board surfaces and cooling channel surfaces can be treated to obtain good heat emission and good heat absorption respectively.

It is practical to position the guide strips 3a, 3b so that the distance "a" will correspond to the distance "b". This principle rule can be ignored, however, when different given effects apply for the mutually opposing surfaces of the circuit board. Distance adaptation enables the creation of conditions for equivalent heat transfer from both sides. This adjustment can be achieved by selecting different distances "a" and "b" respectively, among other things.

The degree of heat emitted by the surface 22a' or the like to the air flow can be increased by enlarging the area of the surface 22a', by giving the surface a sawtooth configuration (as shown in the enlarged insert).

According to practice trails, the cooling channel 4b shall have a thickness "c" of 8–15 mm, preferably about 11 mm, a width "d" of 15–50 cm and a length corresponding to the hight of the magazine.

The invention also relates to a number of embodiments of channel cross-sectional configurations.

Figure 6:
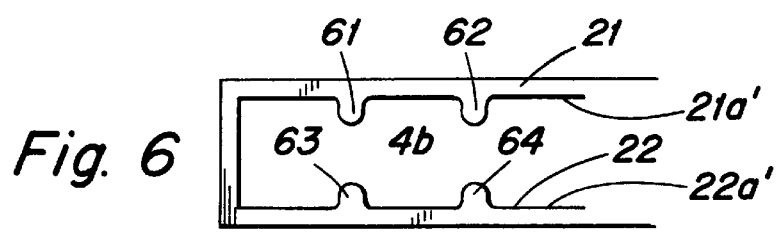
FIG. 6 is a cross-sectional view of a second embodiment of a cooling channel.

FIG. 6 illustrates a second embodiment of the cross-sectional shape of a cooling channel 4b. In this case, the wall-parts 21, 22 have been provided with a plurality of ridges 61–64 which extend into the channel 4b so as to enlarge the area of the inner surfaces 21a' and 22a' respectively.

Figure 7:
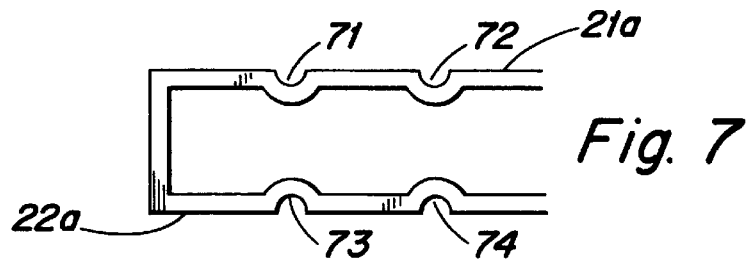
FIG. 7 is a cross-sectional view of a third embodiment of a cooling channel.

FIG. 7 illustrates a third embodiment which includes external grooves 71–74 which enlarge the surface area of respective outer surfaces 21a and 22a.

Figures 8, 9:
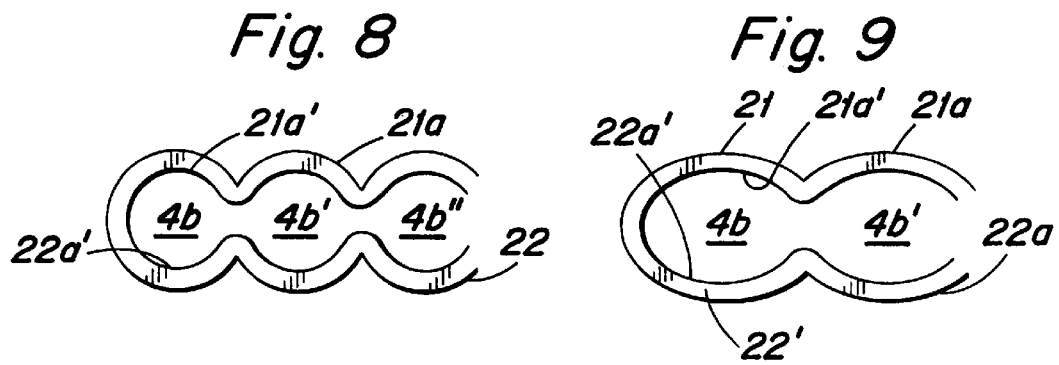
FIG. 8 is a cross-sectional view of a fourth embodiment of a cooling channel.
FIG. 9 is a cross-sectional view of a fifth embodiment of a cooling channel.

The take-up of heat in the walls of the cooling channel is, among other things, dependent on the temperature gradient and distance, and FIG. 8 illustrates a fourth embodiment which includes a plurality of cylindrical air channels 4b, 4b' and 4b". These channels may either be separate from one another or, as shown in FIG. 8, joined together with a surface enlargement f the surfaces 21a and 22a respectively and the surfaces 21a' and 22a' respectively.

FIG. 9 illustrates an alternative to the embodiment of FIG. 8, in which the cooling channels have an elliptical cross-section.

In the FIG. 9 embodiment, the channel wall 22' is also slightly thicker than the channel wall 21.

Figure 10:
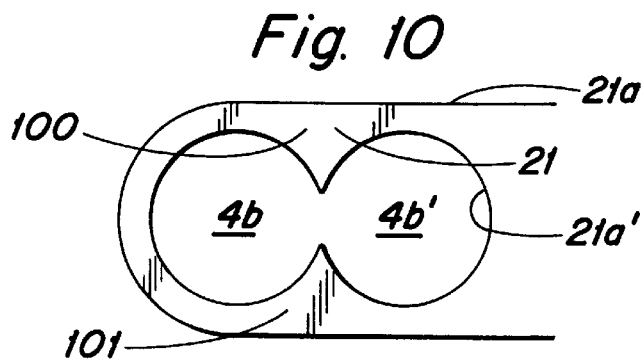
FIG. 10 is a cross-sectional view of a sixth embodiment of a cooling channel.

FIG. 10 shows a sixth embodiment in which the outer surface 21a is flat whereas the cooling channels 4b, 4b' have a circular cross-section. This embodiment thus includes a thickened pointed sections 100, 101, which distribute heat to the inner surfaces 21a' forming the cooling channels 4b, 4b'.

Figure 11:
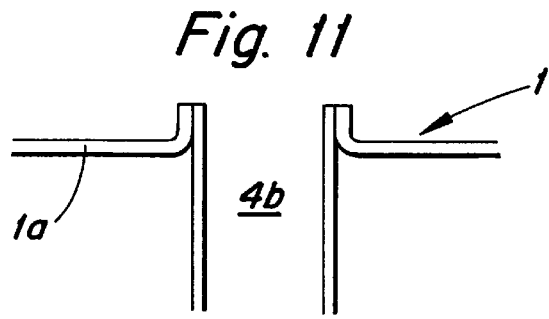
FIG. 11 is a sectional side view of the attachment of a cooling channel to the upper part of the magazine.

The cooling channel 4b illustrated in FIG. 11 is produced from sheetmetal and scarfed to the magazine 1 (or attached thereto in some corresponding manner).

It will be noted that the embodiments illustrated in FIGS. 2, 6, 7, 8, 9 and 10 are well suited for extrusion.

Light-metals can be used in this regard, and also plastic.

Electrically conductive material can be added to plastic to obtain an EMC-shield or the plastic profile may be provided with inner and/or outer electrically conductive foil.

The proposals given in respect of a described embodiment can well be applied to each other embodiment and modifications can be made within the scope of the inventive concept.

For instance, it is proposed that provisions are created for a thicker material in the cooling channel wall-part around high power areas.

It is not necessary for all cooling channels to be identical with one another, and different channels may be given different cross-sectional configurations.

It will be understood that the invention is not limited to the illustrated and described embodiments and that modifications can be made within the scope of the inventive concept as defined in the following Claims.

What is claimed is:

1. A magazine for holding a plurality of circuit boards in vertical side-by-side relationship comprising:

opposing upper and lower inner wall-parts on which guide strips are mounted, wherein mutually opposing and mutually corresponding guide strips are adapted for coaction with mutually opposing edge-parts of one of said plurality of circuit boards to receive one of said plurality of circuit boards having a number of edge-related contact surfaces in the magazine and into mechanical and electrical coaction between said contact surfaces and guide strips, and to enable one of said plurality of circuit boards to be withdrawn from the magazine, and means for dissipating heat developed by the circuit board to the outside of the magazine, said means including a plurality of cooling channels that are delimited by wall-parts, wherein two of these wall-parts are placed proximate one another, with their outer surfaces facing towards a respective adjacent circuit board position, wherein the mutually opposing upper and lower open end-parts of respective cooling channels extend towards a respective mutually opposing upper and lower wall-part and are positioned between two mutually adjacent guide strips, and wherein the circuit board and its components are positioned adjacent to one of said two mutually opposing channel-forming wall parts.

2. A magazine according to claim 1, wherein one of said plurality of circuit boards is positioned closely adjacent to a wall-part of one cooling channel; and in that discrete components on said circuit board are positioned closely adjacent to a wall-part of an adjacent cooling channel.

3. A magazine according to claim 1, characterized in that the number of circuit board positions is one more than the number of cooling channels.

4. A magazine according to claim 1, characterized in that the distance between mutually opposing wall-parts of respective cooling channels is from 8–15 mm.

5. A magazine according to claim 1, further comprising a cover which encloses the circuit board to form an electromagnetic shield.

6. A magazine according to claim 1, wherein a distance between a surface of one of said plurality of printed circuit boards and the outer surface of a cooling channel is less than 2 mm.

7. A magazine according to claim 1, characterized in that the distances are adapted to provide equivalent heat transport.

8. A magazine according to claim 1, wherein a distance between a component and the outer surface of a cooling channel is less than 2 mm.

9. A magazine according to claim 8, characterized in that the distances are adapted to provide equivalent heat transport.

10. A magazine according to claim 1, wherein distances between components and the outer surface of a cooling channel are adapted to provide equivalent heat transport.

11. A magazine according to claim 1, characterized in that the cooling channel is adapted for a cooling air flow.

12. A magazine according to claim 11, characterized by cooling channels comprised of extruded light-metal profiles.

13. A magazine according to claim 1, characterized by cooling channels comprised of extruded light-metal profiles.

14. A magazine according to claim 1, characterized in that at least one cooling channel is provided with a plurality of inwardly extending surface-enlarging ridges.

15. A magazine according to claim 1, characterized in that at least one cooling channel is provided with outer surface-enlarging grooves.

16. A magazine according to claim 1, characterized in that at least one cooling channel has a number of air channels, and that respective air channel has a pronounced circuit or a pronounced elliptical cross-sectional shape.

17. A magazine according to claim 16, wherein the outer surface of said cooling channel is flat.

18. A magazine according to claim 16, wherein the outer surface of said cooling channel is grooved.

19. A magazine according to claim 1, wherein the wall-parts of the magazine are formed from a plastic material.

20. A magazine according to claim 19, wherein the cooling channels of the magazine are formed from a plastic material.

21. A magazine according to claim 1, wherein said cooling channels extend through said respective mutually opposing upper and lower wall-part.

22. A magazine according to claim 1, wherein the cooling channels of the magazine are formed from a plastic material.

23. A magazine for enclosing a plurality of circuit boards, comprising:
- at least one removable outer wall configured to allow entry and removal of said circuit boards into said magazine;
- a plurality of inner partitions contained within outer walls of said magazine;
- a plurality of compartments formed by said inner partitions and said outer walls;
- a plurality of guiding elements within said compartments positioned on one of said outer walls, each configured to guide a circuit board in an orientation parallel to said inner partitions; and
- a heat dissipation element made up of a plurality of cooling channels contained within the inner partitions.

* * * * *